(12) United States Patent
Cheng

(10) Patent No.: US 7,456,087 B2
(45) Date of Patent: Nov. 25, 2008

(54) SEMICONDUCTOR DEVICE AND METHOD OF FABRICATING THE SAME

(75) Inventor: Po-Lun Cheng, Kaohsiung County (TW)

(73) Assignee: United Microelectronics Corp., Hsinchu (TW)

( * ) Notice: Subject to any disclaimer, the term of this patent is extended or adjusted under 35 U.S.C. 154(b) by 56 days.

(21) Appl. No.: 11/673,161

(22) Filed: Feb. 9, 2007

(65) Prior Publication Data
US 2008/0191206 A1    Aug. 14, 2008

(51) Int. Cl.
*H01L 21/20* (2006.01)
*H01L 21/336* (2006.01)

(52) U.S. Cl. .............. 438/584; 257/E21.001; 438/285

(58) Field of Classification Search ........... 257/E21.001
See application file for complete search history.

(56) References Cited

U.S. PATENT DOCUMENTS

| | | | | |
|---|---|---|---|---|
| 6,599,803 B2* | 7/2003 | Weon et al. | ................ | 438/300 |
| 6,995,054 B2* | 2/2006 | Oda et al. | ................ | 438/197 |
| 7,172,933 B2* | 2/2007 | Huang et al. | ................ | 438/197 |
| 7,176,481 B2* | 2/2007 | Chen et al. | ................ | 257/19 |
| 7,364,957 B2* | 4/2008 | Thei et al. | ................ | 438/197 |
| 2005/0148148 A1* | 7/2005 | Cheng | ................ | 438/299 |

* cited by examiner

*Primary Examiner*—Walter L Lindsay, Jr.
*Assistant Examiner*—Mohsen Ahmadi
(74) *Attorney, Agent, or Firm*—J.C. Patents

(57) ABSTRACT

A semiconductor device is provided. The semiconductor device comprises a substrate, a gate structure, a spacer, a first poly-SiGe layer being boron-doped and a second poly-SiGe layer being boron-doped. The substrate has two openings and the gate structure is disposed on the substrate between the openings. The spacer is disposed on the sidewalls of the gate structure and above a portion of the openings. The first poly-SiGe layer is disposed on the surface of the openings in the substrate. The second poly-SiGe layer is disposed on the first poly-SiGe layer, and the top of the second poly-SiGe layer is higher than the surface of the substrate. Moreover, the boron concentration in the first poly-SiGe layer is lower than that in the second poly-SiGe layer.

11 Claims, 5 Drawing Sheets

SEMICONDUCTOR DEVICE AND METHOD OF FABRICATING THE SAME

BACKGROUND OF THE INVENTION

1. Field of the Invention

The present invention relates to a device structure of an integrated circuit. More particularly, the present invention relates to a semiconductor device and a manufacturing method thereof.

2. Description of Related Art

In semiconductor devices fabricated using silicon metal oxide, when the gate length is scaled down to deep submicron level, the time required for charge carriers to travel is shortened, improving the overall efficiency of the device. Nonetheless, the techniques required to shrink the gate length are still under development since there are numerous problems to be overcome.

Currently, to obtain more excellent device efficiency efficient, techniques for fabricating source/drain of metal-oxide-semiconductor transistors using a SiGe process has been actively developing. SiGe materials can be selectively grown on the source/drain regions. In contrast to silicon and silicon oxide, SiGe materials can also be selectively etched.

Usually, the source/drain region fabricated by SiGe process is doped with highly concentrated boron to decrease the resistance. Moreover, in transistor devices using a SiGe layer heavily doped with boron as the source/drain regions, the higher the dopant concentration, the better the current gain for the device. Nevertheless, the boron dopants in the SiGe inevitably diffuse out of the source/drain regions. If the boron dopant diffuses out vertically, the junction depth will be too deep and problems like punch through effect arise. If the boron dopant diffuses out horizontally, short channel effect will occur, affecting the overall efficiency of the device.

Therefore, to fabricate source/drain regions of the transistor devices using SiGe without the above-mentioned problems has become the main focus of development in the industry.

SUMMARY OF THE INVENTION

Accordingly, the present invention is directed to provide a semiconductor device and a method of fabricating the same, which eliminates and prevents problems that affect the efficiency of the device, including diffusion of the boron dopants out of the SiGe layer, punch through effect and short channel effect.

The present invention provides a semiconductor device which comprises a substrate, a gate structure, a spacer, a first SiGe layer being boron-doped and a second SiGe layer being boron-doped. Herein, the substrate has two openings and the gate structure is disposed on the substrate between the openings. The spacer is disposed on the sidewalls of the gate structure and above a portion of the openings. Further, the first SiGe layer is disposed on the surface of the openings in the substrate and the second SiGe layer is disposed on the first SiGe layer. Moreover, the top of the second SiGe layer is higher than the surface of the substrate. Herein, the boron concentration in the first SiGe layer is lower than that in the second SiGe layer.

According to the embodiment of the present invention, the semiconductor can further comprise at least one third SiGe layer being boron-doped. The third SiGe layer is disposed between the first SiGe layer and the second SiGe layer. Further, the boron concentration in the third SiGe layer is in between the boron concentration in the first SiGe layer and that in the second SiGe layer.

According to the embodiment of the present invention, the amount of germanium in the first SiGe layer is greater than that for the second SiGe layer. On the other hand, the amount of germanium in the first SiGe layer is equal to that in the second SiGe layer.

The present invention provides another semiconductor device which comprises a substrate, a gate structure, a spacer, a SiGe layer being boron-doped. Herein, the substrate has two openings and the gate structure is disposed on the substrate between the openings. The spacer is disposed on the sidewalls of the gate structure and above a portion of the openings. The spacer is disposed on the sidewalls of the gate structure and above a portion of the openings and the SiGe layer has a gradient boron concentration that decreases towards the substrate.

According to the embodiment of the present invention, the SiGe layer has a gradient germanium amount that increases towards the substrate. On the other hand, the amount of germanium in the SiGe layer can be a fixed value.

The present invention also provides a method for fabricating a semiconductor device. First, a gate oxide layer and a gate conductive layer are sequentially formed on a substrate. Next, a gate structure is formed by defining the gate conductive layer and the gate oxide layer. Then, a spacer is formed on the sidewalls of the gate structure. Thereafter, two openings are formed in the substrate beside both sides of the spacer and the openings extend to a portion underlying the spacer. Afterward, a first SiGe layer being boron-doped and a second SiGe layer being boron-doped are sequentially formed on the openings. Further, the top of the second SiGe layer is higher than the surface of the substrate and the boron concentration in the first SiGe layer is lower than that in the second SiGe layer.

According to the embodiment of the present invention, it can further comprise forming at least one third SiGe layer being boron-doped between the first SiGe layer and the second SiGe layer. Further, the boron concentration of the third SiGe layer falls between the boron concentration in the first SiGe layer and that in the second SiGe layer. On the other hand, the amount of germanium in the first SiGe layer is higher than that for the second SiGe layer. Nonetheless, the amount of germanium in the first SiGe layer can be equal to that for the second SiGe layer. The first SiGe layer and the second SiGe layer can be fabricated by, for instance, a chemical vapor deposition (CVD) process. The openings formed in the substrate beside both sides of the spacer can be fabricated by, for instance, an isotropic etching process. On the other hand, after the formation of the openings, a pre-cleaning process can be performed to the openings.

The present invention provides another method for fabricating a semiconductor device. First, a gate oxide layer and a gate conductive layer are sequentially formed on a substrate. Next, a gate structure is formed by defining the gate conductive layer and the gate oxide layer. Then, a spacer is formed on the sidewalls of the gate structure. Thereafter, two openings are formed in the substrate beside both sides of the spacer and the openings extend to a portion underlying the spacer. Afterwards, a SiGe layer being boron-doped is formed on the openings and the top of the SiGe layer is higher than that of the surface of the substrate. Further, the SiGe layer has a gradient boron concentration that decreases towards the substrate.

According to the embodiment of the present invention, the SiGe layer has a gradient germanium amount that increases towards the substrate. Further, the germanium concentration of the SiGe layer can be a fixed value. The SiGe layer is fabricated by, for instance, a chemical vapor deposition. The openings formed in the substrate beside both sides of the spacer can be fabricated by, for instance, an isotropic etching process. Moreover, after the formation of the openings, a pre-cleaning process can be performed to the openings.

The semiconductor device of the present invention is fabricated as either a double layer of different boron concentration or a multiple SiGe layer as the source/drain. Further, the part of the SiGe layer in contact with the substrate has a lower boron concentration. Hence, the present invention can effectively prevent the diffusion of boron dopant out of the source/drain to overcome the issues such as punch through effect and short channel effect, resulted from severe diffusion of boron dopants in the art.

In order to the make the aforementioned and other objects, features and advantages of the present invention comprehensible, a preferred embodiment accompanied with figures are described in detail below.

DESCRIPTION OF EMBODIMENTS

Figure 1:
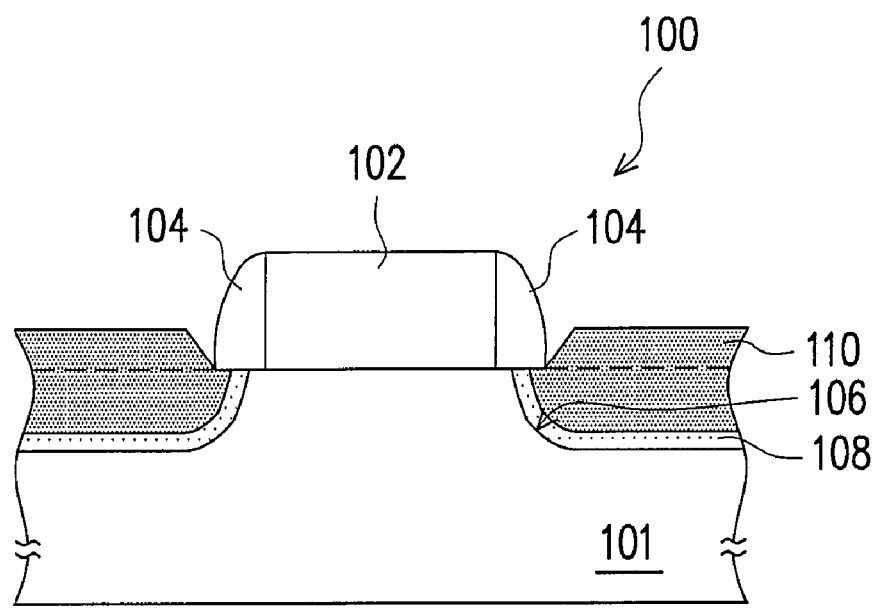
FIG. 1 is a schematic cross-sectional view illustrating a semiconductor device according to one embodiment of the present invention.

FIG. 1 is a schematic cross-sectional view illustrating a semiconductor device according to one embodiment of the present invention.

In FIG. 1, a semiconductor device 100 of the present invention comprises a substrate 101, a gate structure 102, a spacer 104, a first SiGe layer 108 being boron-doped and a second SiGe layer 110 being boron-doped. The substrate 101 is, for instance, a silicon substrate or other suitable semiconductor substrate and there are two openings 106 in the substrate 101. The gate structure 102 is disposed on the substrate 101 between the openings 106. Further, the gate structure 102 comprises, for instance, a gate dielectric layer (not shown) and a gate conductive layer (not shown). In addition, the materials for forming the gate structure 102 are well known to one of ordinary skill in the art, and are not described herein. Moreover, the spacer 104 is disposed on the sidewalls of the gate structure 102 and above a portion of the openings 106. The spacer 104 can be, for instance, a single layer spacer structure or a multiple layer spacer structure, wherein a multiple layer spacer structure comprises at least one offset spacer and a spacer.

According to the present embodiment, the first SiGe layer 108 is disposed on the surface of the openings 106. The second SiGe layer 110 is disposed on the first SiGe layer 108 and the top of the second SiGe layer is higher than that of the surface of the substrate 101. Further, the boron concentration of the first SiGe layer 108 is lower than that of the second SiGe layer 110. In the present embodiment, the amount of germanium in the first SiGe layer 108 is equal to that in the second SiGe layer 110. The first SiGe layer 108 and the second SiGe layer 110 are used as the source/drain of the semiconductor device 100 to provide a lower resistance and reduce current leakage.

It should be noted that the first SiGe layer 108 has a lower boron concentration, which prevents the boron dopants from diffusing out of the entire source/drain, to overcome the issues such as punch through effect and short channel effect, resulted from severe diffusion of boron dopants in the art. More specifically, the source/drain of the semiconductor device 100 according to the present embodiment comprises two SiGe layers having different boron concentrations. Further, the first SiGe layer 108 that is in contact with the substrate 101 has a lower boron concentration. In contrast to the heavily SiGe layer being boron-doped used by the conventional semiconductor devices as the source/drain, the present invention can effectively prevent severe diffusion of boron dopants.

Moreover, in one embodiment, the amount of germanium in the first SiGe layer 108 is higher than that for the second SiGe layer 110, which also serves the purpose of preventing severe diffusion of boron dopants.

In another embodiment, the semiconductor device 100 further comprises at least one third SiGe layer (not shown). The third SiGe layer can be disposed between the first SiGe layer 108 and the second SiGe layer 110. Further, the boron concentration in the third SiGe layer is in between the boron concentration in the first SiGe layer 108 and that in the second SiGe layer 110.

Figure 2:
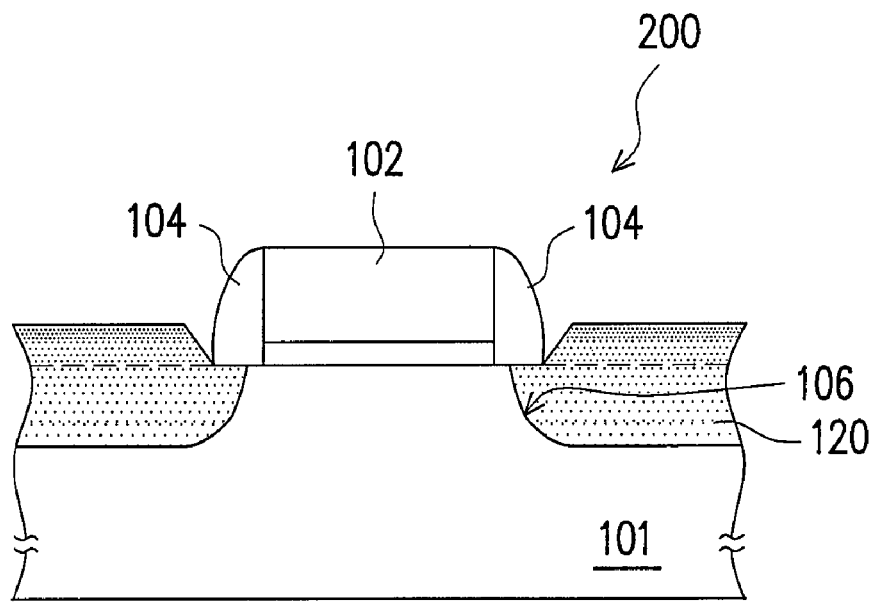
FIG. 2 is a schematic cross-sectional view illustrating a semiconductor device according to another embodiment of the present invention.

In addition to the above-mentioned embodiments, the present invention also comprises other implementations. FIG. 2 is a schematic cross-sectional view illustrating a semiconductor device according to another embodiment of the present invention. The same reference numbers used in FIG. 1 are used to refer to the same components in FIG. 2.

In FIG. 2, a semiconductor device 200 of the present invention comprises a substrate 101, a gate structure 102, a spacer 104, a SiGe layer 120 being boron-doped. Herein, the gate structure 102 is disposed on the substrate 101 between the openings 106. The spacer 104 is disposed on the sidewalls of the gate structure 102 and above the openings 106. Further, a SiGe layer 120 being boron-doped is disposed on the openings 106 and the top of the SiGe layer 120 is higher than the surface of the substrate 101. Moreover, the SiGe layer 120 has a gradient boron concentration that decreases towards the substrate 101. In the present embodiment, the amount of germanium in the SiGe layer 120 can be a fixed value.

Similarly, the part of the SiGe layer 120 that is in contact with the substrate 101 has a lower boron concentration, which prevents the boron dopants from diffusing out of the source/drain, to overcome the issues, resulted from severe diffusion of boron dopants in the art.

On the other hand, in one embodiment, the SiGe layer 120 can comprise a gradient germanium amount that increases towards the substrate 101, which also serves the purpose of preventing severe diffusion of the boron dopants.

FIGS. 3 to 5 and FIGS. 6(a) and 6(b) are used to further illustrate the method for fabricating the semiconductor device of the present invention as follows. FIGS. 3 to 5 and FIGS. 6(a) and 6(b) are cross-sectional views illustrating the steps for fabricating a semiconductor device according to embodiments of the present invention.

Figure 3:
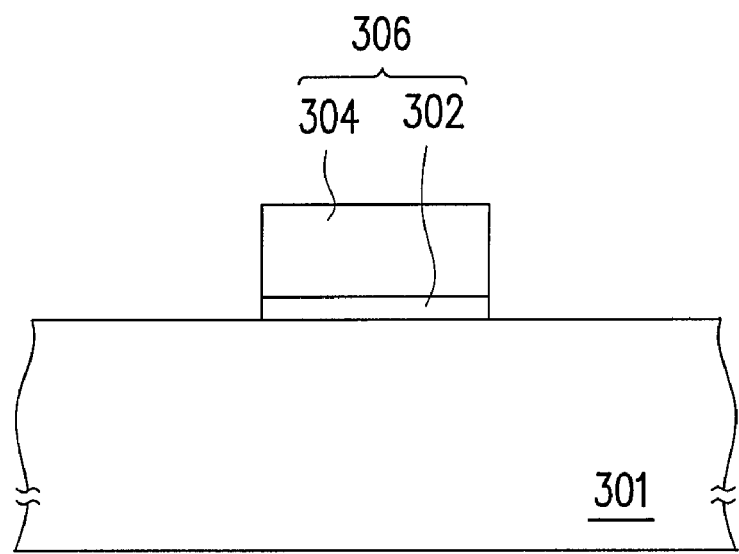
FIGS. 3 to 5 and FIGS. 6(a) and 6(b) are cross-sectional views illustrating the steps for fabricating a semiconductor device according to embodiments of the present invention.

First, in FIG. 3, a gate oxide layer 302 is formed on a substrate 301. The material of the gate oxide layer 302 is, for instance, silicon oxide, and the method for forming the same is, for instance, a thermal oxidation process. Next, a gate conductive layer 304 is formed on the gate oxide layer 302. The material of the gate conductive layer 304 is, for instance, polysilicon, and the method for forming the same is, for instance, a chemical vapor deposition.

Then, a gate structure 306 is formed by defining the gate conductive layer 304 and the gate oxide layer 302. The method for forming the gate structure 306 is, for instance, forming a patterned mask layer on the gate conductive layer 304, followed by an etching process that removes a portion of the gate conductive layer 304 and the gate oxide layer 302 using the patterned mask layer as a mask.

Figure 4:
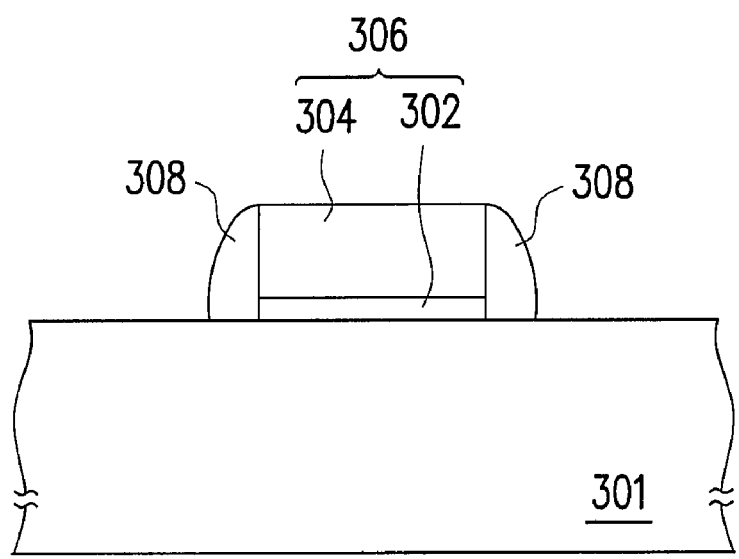

Thereafter, in FIG. 4, a spacer 308 is formed on the sidewalls of the gate structure 306. The spacer 308 can be, for instance, either a single layer spacer structure or a multiple layer spacer structure. If the spacer 308 is a single-layer spacer structure, then the material of the spacer is silicon nitride. On the other hand, if the spacer 308 is a multiple-layer spacer structure, then the materials of the spacer is, for instance, silicon oxide/silicon nitride.

Figure 5:
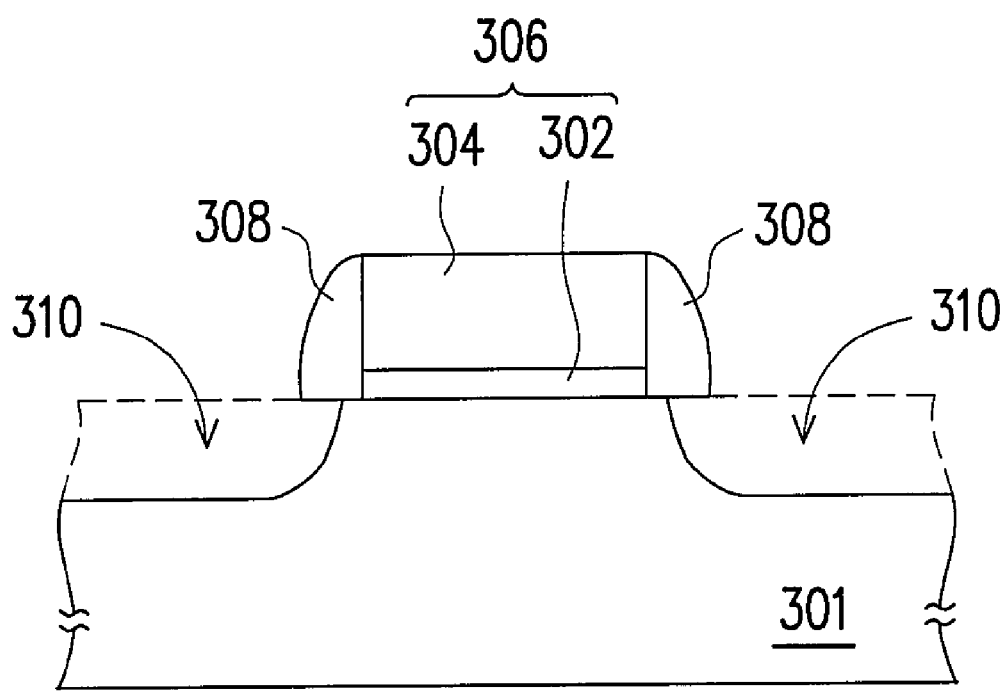

Afterwards, in FIG. 5, two openings 310 are formed in the substrate 301 beside both sides of the spacer 308. The method for forming the openings 301 comprises, for instance, performing an isotropic etching process to remove a portion of the substrate 301 beside both sides of the spacer 308. As a result, a portion of the openings 301 formed extend to a region below the spacer 308. In the present embodiment, the depth of the openings 310 can be between 700 nm and 800 mm. Further, after the formation of the openings 310, a pre-cleaning process is usually performed to the bottom of the openings 310 on the surface of the substrate 301.

Figure 6A:
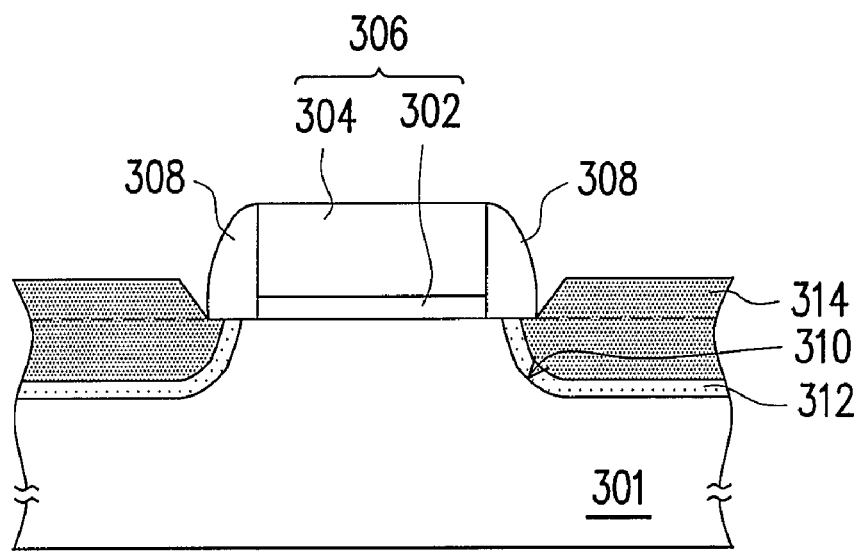
Figure 6B:
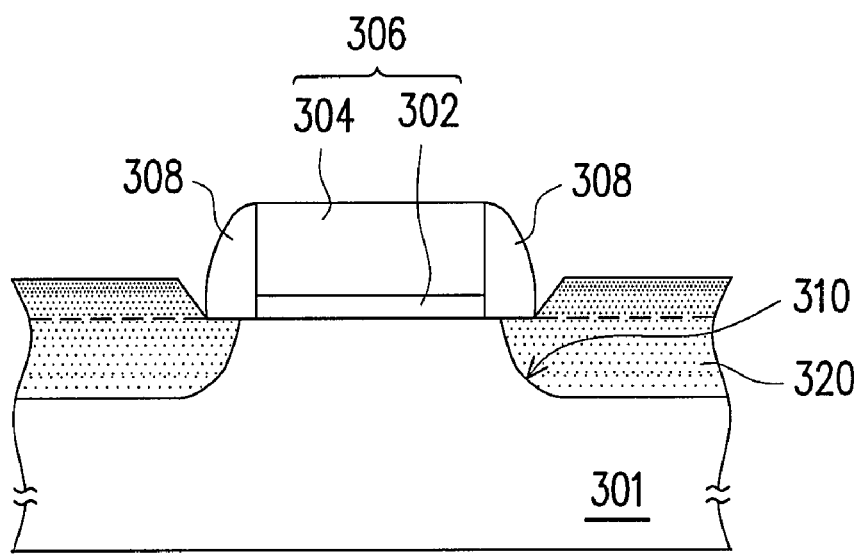

Thereafter, in FIG. 6(a) and FIG. 6(b), SiGe layers having different boron concentrations are formed in the openings 310, which are used as the source/drain of the semiconductor device. Herein, the structure shown in FIG. 6(a) comprises two SiGe layers 312 and 314 having different boron concentrations. On the other hand, the structure shown in FIG. 6(b) comprises a SiGe layer 320 having a gradient boron concentration that decreases towards the substrate 301.

The method for fabricating the structure shown in FIG. 6(a) is, for instance, a chemical vapor deposition. More specifically, first $GeH_4$ and $Si_2H_6$ are used as the reaction gases and $H_2$ or $N_2$ as the carrier gas to deposit a SiGe material layer. Then, the SiGe layer is implanted with boron ions to form a SiGe layer 312. The thickness of the SiGe layer 312 is approximately 100 nm. The boron doping concentration in the SiGe layer 312 is approximately between $1\times10^{18}$~$5\times10^{19}$ atom/cm$^3$. The amount of germanium in the SiGe layer 312 is approximately 22%. After the formation of the SiGe layer 312, a SiGe layer 314 is formed in situ, which means that the fabrication of the SiGe layer 312 and the SiGe layer 314 can be accomplished in the same reaction chamber or by the same machinery. The thickness of the SiGe layer 314 is approximately 1,100=n. The boron doping concentration in the SiGe layer 314 is approximately between $5\times10^{20}$~$1\times10^{21}$ atom/cm$^3$. The amount of germanium in the SiGe layer 314 is approximately 22%. Further, the amount of germanium in the SiGe layer 312, which is approximately 27%, can also be used for fabricating the SiGe layer 314 while the amount of germanium in the SiGe layer 314 is approximately 22%.

Additionally, the method for fabricating the SiGe layer 320 shown in FIG. 6(b) is, for instance, a chemical vapor deposition. Through adjusting the flow of the reaction gases and the boron doping concentration, a SiGe layer 320 having a gradient boron concentration that decreases toward the substrate 301 is formed in the openings 310. The germanium concentration of the SiGe layer 320 can be a fixed value. Certainly, the SiGe layer can comprise a gradient germanium amount that increases towards the substrate 301.

It should be noted that the steps for fabricating the depth of the openings, the thickness of the SiGe layer, the boron doping concentration or the amount of germanium used in FIG. 3 through FIG. 6 are only exemplary, which are not intended to limit the present invention. Anybody skilled in the art can realize the present invention according to the disclosed features of the present invention.

Figure 7:
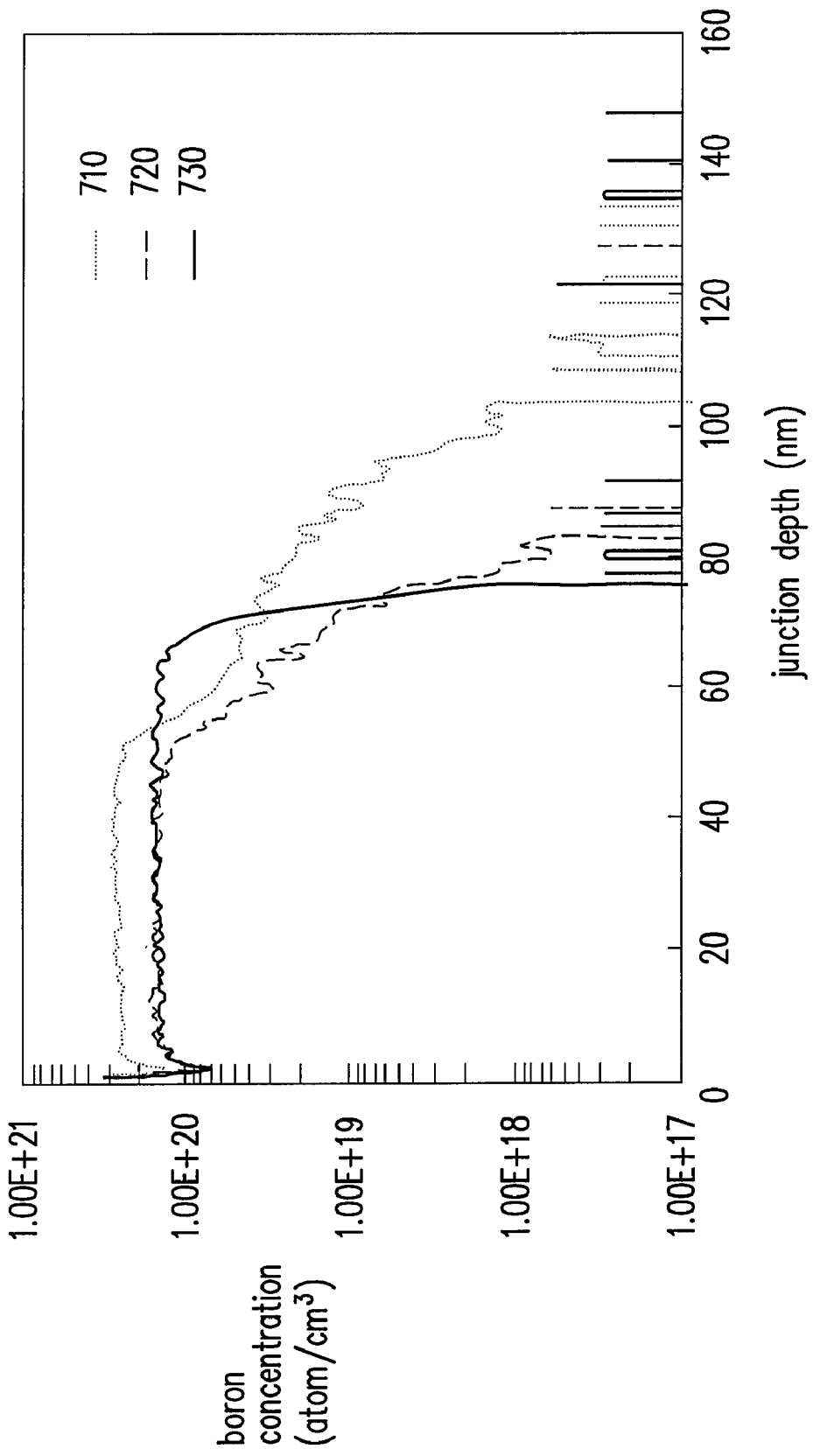
FIG. 7 is a graph illustrating the relationship between the boron concentration of the SiGe layer and the junction depth of the source/drain of the semiconductor device.

Next, FIG. 7 is used to further illustrate the effectiveness of the present invention as follows.

FIG. 7 is a graph illustrating the relationship between the boron concentration in the SiGe layer and the junction depth of the source/drain of the semiconductor device. Herein, the X-axis represents the junction depth of the source/drain in nm and the Y-axis represents the boron concentration in the SiGe layer in atom/cm$^3$. As shown in FIG. 7, curves 720 and 730 show a lower boron concentration than curve 710. Further, after diffusion, the junction depths for curves 720 and 730 are lower than that for curve 710. Therefore, it can be determined from FIG. 7 that when the boron concentration is lower, the junction depth will be lower after diffusion. Hence, in the semiconductor of the present invention, the SiGe layer having a lower boron concentration that is in contact with the substrate can effectively prevent severe diffusion of boron dopants.

Accordingly, the present invention can effectively prevent the diffusion of boron dopants out of the source/drain to overcome the issues such as punch through effect and short channel effect, resulted from severe diffusion of boron dopants in the art.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A method of fabricating a semiconductor device, comprising:
   forming a gate oxide layer and a gate conductive layer sequentially on a substrate;
   forming a gate structure by defining the gate conductive layer and the gate oxide layer;
   forming a spacer on the sidewalls of the gate structure;
   forming two openings in the substrate beside both sides of the spacer and a portion extending to a region below the spacer;
   forming a first SiGe layer being boron-doped and a second SiGe layer being boron-doped sequentially on the openings, wherein the top of the second SiGe layer is higher than the surface of the substrate and the boron concentration in the first SiGe layer is lower than that in the second SiGe layer; and
   wherein the amount of germanium in the first SiGe layer is greater than that in the second SiGe layer,
   wherein the amount of germanium in the first SiGe layer is greater than that in the second SiGe layer.

2. The method of fabricating a semiconductor device of claim 1, further comprising at least one third SiGe layer being boron-doped forming between the first SiGe layer and the second SiGe layer, and the boron concentration in the third SiGe layer is in between the boron concentration in first SiGe layer and that in the second SiGe layer.

3. The method of fabricating a semiconductor devices of claim 1, wherein the amount of germanium in the first SiGe layer is equal to that in the second SiGe layer.

4. The method of fabricating a semiconductor device of claim 1, wherein the method for forming the second SiGe layer comprises a chemical vapor deposition.

5. The method of fabricating a semiconductor device of claim 1, wherein the method for forming the openings in the substrate beside both sides of the spacer comprises an isotropic etching process.

6. The method of fabricating a semiconductor device of claim 1, further comprising performing a pre-cleaning process to the openings after the formation of the openings.

7. A method of fabricating a semiconductor device, comprising:
 forming a gate oxide layer and a gate conductive layer sequentially on a substrate;
 forming a gate structure by defining the gate conductive layer and the gate oxide layer;
 forming a spacer on the sidewalls of the gate structure;
 forming two openings in the substrate beside both sides of the spacer and a portion extending to a region below the spacer;
 forming a SiGe layer being boron-doped having a gradient boron concentration that decreases toward the substrate, wherein the top of the SiGe layer is higher than the surface of the substrate,
 wherein the SiGe layer has a gradient germanium amount that increases towards the substrate.

8. The method of fabricating a semiconductor device of claim 7, wherein the amount of germanium in the SiGe layer is a fixed value.

9. The method of fabricating a semiconductor device of claim 7, wherein the method for forming the SiGe layer comprises a chemical vapor deposition.

10. The method of fabricating a semiconductor device of claim 7, wherein the method for forming the openings in the substrate beside both sides of the spacer comprises an isotropic etching process.

11. The method of fabricating a semiconductor device of claim 7, further comprising performing a pre-cleaning process to the openings after the formation of the openings.

\* \* \* \* \*